United States Patent
Dakhiya et al.

(10) Patent No.: US 10,050,324 B2
(45) Date of Patent: Aug. 14, 2018

(54) WIDE BAND RADIO FREQUENCY CIRCULATOR

(71) Applicant: Eagantu Ltd., Ra'anana (IL)

(72) Inventors: Michael Dakhiya, Tel Aviv (IL); Eran Shaked, Ra'anana (IL)

(73) Assignee: Eagantu Ltd., Ra'anana (IL)

( * ) Notice: Subject to any disclaimer, the term of this patent is extended or adjusted under 35 U.S.C. 154(b) by 0 days.

(21) Appl. No.: 15/876,648

(22) Filed: Jan. 22, 2018

(65) Prior Publication Data

US 2018/0145390 A1 May 24, 2018

Related U.S. Application Data

(63) Continuation of application No. 15/481,257, filed on Apr. 6, 2017, now Pat. No. 9,912,028.

(60) Provisional application No. 62/323,814, filed on Apr. 18, 2016, provisional application No. 62/360,398, filed on Jul. 10, 2016.

(51) Int. Cl.
*H01P 1/397* (2006.01)
*H04B 1/40* (2015.01)
*H03H 7/00* (2006.01)

(52) U.S. Cl.
CPC ............ *H01P 1/397* (2013.01); *H03H 7/004* (2013.01); *H04B 1/40* (2013.01)

(58) Field of Classification Search
CPC ......... H01P 1/397; H01P 1/387; H03H 7/004; H03H 7/00; H03H 17/0009
See application file for complete search history.

(56) References Cited

U.S. PATENT DOCUMENTS

| | | |
|---|---|---|
| 3,426,298 A | 2/1969 | E et al. |
| 4,311,974 A | 1/1982 | Reddy |
| 4,677,399 A | 6/1987 | Dain et al. |
| 5,144,266 A | 9/1992 | Dougherty et al. |
| 5,159,298 A | 10/1992 | Dydyk |
| 5,424,694 A | 6/1995 | Maloratsky et al. |
| 5,532,667 A | 7/1996 | Haertling et al. |
| 5,608,361 A * | 3/1997 | Weiss ............... H01P 1/387 333/1.1 |
| 6,066,994 A | 5/2000 | Shepherd et al. |
| 6,067,448 A | 5/2000 | Ho et al. |
| 6,140,887 A | 10/2000 | Zheng |
| 7,260,281 B2 * | 8/2007 | Salib .............. G02B 6/2746 359/484.03 |

(Continued)

OTHER PUBLICATIONS

The International Search Report and the Written Opinion of the International Searching Authority for PCT/US2017/026431, ISA/RU, Moscow, Russia, dated Aug. 14, 2017.

*Primary Examiner* — Devan Sandiford
(74) *Attorney, Agent, or Firm* — M&B IP Analysts, LLC (57) ABSTRACT

A wide band radio frequency (RF) circulator is presented. The RF circulator includes at least one stage having four ports configured to circulate an input RF signal from a first port to a second port while isolating a third port, from the second port to the third port while isolating the first port, and from the third port to the first port while isolating the first port, wherein the fourth port is grounded; and wherein the at least one stage includes at least a pair of couplers connected via a delay line, wherein each coupler includes a main transmission line and a coupling transmission line disposed on distinct dielectric layers.

18 Claims, 5 Drawing Sheets

(56) References Cited

U.S. PATENT DOCUMENTS

| | | | |
|---|---|---|---|
| 7,664,346 B2* | 2/2010 | Mizumoto | G02F 1/0955 385/11 |
| 7,741,929 B2 | 6/2010 | Hash | |
| 7,834,719 B2* | 11/2010 | Cheung | H01P 1/38 333/117 |
| 8,289,102 B2 | 10/2012 | Yamamoto et al. | |
| 8,369,268 B2* | 2/2013 | Rausch | H04B 7/15557 370/328 |
| 8,717,117 B2* | 5/2014 | Mung | H01P 1/38 333/100 |
| 9,048,933 B2* | 6/2015 | Kwon | H04B 1/58 |
| 9,203,133 B2 | 12/2015 | Rogers | |
| 9,356,330 B1 | 5/2016 | Donoghue et al. | |
| 9,543,631 B1 | 1/2017 | Antkowiak | |
| 9,543,632 B2 | 1/2017 | Katabuchi et al. | |
| 9,553,349 B2 | 1/2017 | Mukaiyama | |
| 2002/0097946 A1* | 7/2002 | Fujita | G02F 1/0955 385/11 |
| 2005/0275586 A1* | 12/2005 | Macdonald | H01P 1/397 342/175 |
| 2006/0087376 A1* | 4/2006 | Young | H03F 1/523 330/286 |
| 2006/0139118 A1* | 6/2006 | Vaughn | H01P 1/387 333/1.1 |
| 2009/0108954 A1* | 4/2009 | Cheung | H01P 1/10 333/1.1 |
| 2010/0289598 A1* | 11/2010 | Cheung | H01P 1/213 333/109 |
| 2012/0293023 A1* | 11/2012 | Harris | H01P 1/19 310/26 |
| 2013/0021955 A1 | 1/2013 | Duron et al. | |
| 2014/0002196 A1* | 1/2014 | Leek | H03L 7/00 331/6 |
| 2014/0010123 A1 | 1/2014 | Sarca | |
| 2015/0163044 A1* | 6/2015 | Analui | H04L 5/1461 370/295 |
| 2016/0028363 A1 | 1/2016 | Li | |

* cited by examiner

WIDE BAND RADIO FREQUENCY CIRCULATOR

CROSS-REFERENCE TO RELATED APPLICATIONS

This application is a continuation of U.S. patent application Ser. No. 15/481,257 filed on Apr. 6, 2017, now allowed, which claims the benefit of U.S. Provisional Application No. 62/323,814 filed on Apr. 18, 2016, and of U.S. Provisional Application No. 62/360,398 filed on Jul. 10, 2016. The contents of the above-mentioned applications are hereby incorporated by reference.

TECHNICAL FIELD

The present disclosure relates generally to passive radio frequency (RF) devices and, more particularly, to wide band radio frequency (RF) circulators.

BACKGROUND

Figure 1:
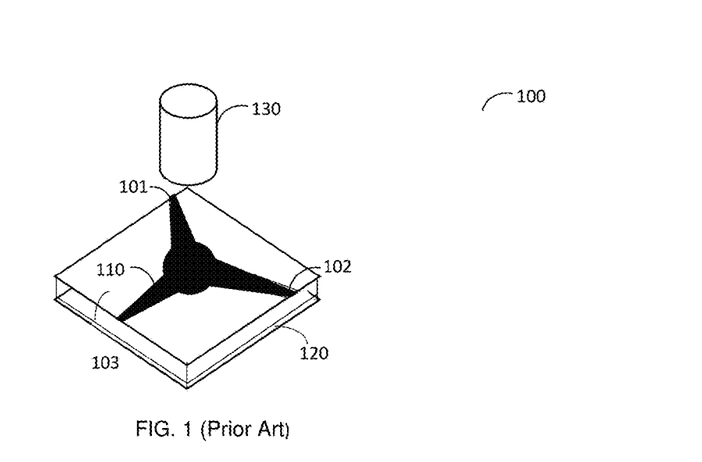
FIG. 1 is schematic diagram of a conventional RF circulator (prior art).

An RF Circulator is a 3-port ferromagnetic passive device designed to regulate a signal flow within a circuit. The RF circulator transmits an input signal in one direction. An example structure of a conventional RF circulator 100 is shown in FIG. 1.

The conventional RF circulator 100 includes a Y-shape conductor (e.g., metal strip) 110 placed on a ferrite substrate 120 and a permanent magnet 130 orthogonal to the Y-shape conductor 110. An RF signal input at port 101 is transmitted to port 102 and isolated from port 103. Similarly, a RF signal input at port 102 is transmitted to port 103 and isolated from port 101, and a signal input at port 103 is transmitted to port 101 and isolated from port 102. Circulators are typically designed to have minimal loss when transmitting an input signal from one port to the other. The conventional RF circulator 100 is typically packaged with a metal case (not shown in FIG. 1).

A common use of an RF circulator is to provide connectivity to an antenna. For example, an input signal is from a transmitter, which outputs at a port coupled to an antenna and isolated at a receiver port. As another example, an input signal from an antenna outputs at a port coupled to a receiver and isolated at the transmitter port.

There are a number of factors that determine the operation of an RF circulator including frequency band (or bandwidth), insertion loss, isolation, power, and package type. The bandwidth is the frequency range over which the device can operate with while providing a constant level of isolation and minimal insertion loss. An insertion loss is measured in decibels (dB) and is the loss of the input signal from one port to the next. The isolation is a measure of relative signal levels at the adjacent ports of the circulator. For example, when a signal is incident at port 101 and transmitted to port 102, the isolation is measured (in dB) between port 101 and port 103. The higher this value, the better the performance of the RF circulator. The power is the level of power in watts that the device can handle while maintaining its electrical characteristics. The package type is the form factor of the RF circulator and determines the size of the package.

Conventional RF circulators are characterized by relatively large physical size, limited bandwidth (approximately 100 MHz), and low isolation (typically 12 dB-18 dB). Although conventional RF circulators may be an alternative to cavity duplexers in base stations, due to their characteristics, they cannot be utilized, for example, in hand-held devices.

For example, the narrow bandwidth is a limiting factor for using a conventional RF circulator in cellular telephones. A telephone should operate in the entire frequency band of RF signals transmitted by the cellular telephone. In modern communication standards, the frequency band (bandwidth) of cellular telephones is about 1 GHz (for the frequency range between 1 GHz and 7 GHz, operating at a multi-band frequency). As discussed above, conventional RF circulators cannot meet this demand. In addition, the insertion loss would cause poor transmission and reception of RF signals.

It would therefore be advantageous to provide a design of a conventional RF circulator that overcomes the limitations noted above.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "some embodiments" may be used herein to refer to a single embodiment or multiple embodiments of the disclosure.

Some embodiments disclosed herein include a wide band radio frequency (RF) circulator. The RF circulator comprises at least one stage having four ports, a first end, and a second end, wherein a first port and a third port are connected at the first end of the at least one stage, wherein a second port and a fourth port are connected at the second end of the at least one stage, wherein each of the at least one stage includes a pair of couplers connected through a first delay line and a second delay line, thereby forming a network of couplers in the at least one stage.

Some embodiments disclosed herein also include a wide band RF circulator comprising: a stage having four ports configured to circulate an input RF signal from a first port to a second port while isolating a third port, from the second port to the third port while isolating the first port, and from the third port to the first port while isolating the first port, wherein the fourth port is grounded; and wherein the at least one stage includes at least a pair of couplers connected via a delay line, wherein each coupler includes a main transmission line and a coupling transmission line disposed on distinct dielectric layers.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

By way of example for the disclosed embodiments, a wide band RF circulator is provided. In an embodiment, the disclosed RF circulator provides a novel design to allow wide bandwidth, low insertion loss, high isolation, and small physical dimensions. The disclosed RF circulator can be operable in a full-duplex mode. In an example embodiment, the bandwidth of the disclosed RF circulator is between 1 GHz-7 GHz at a plurality of distinct frequency bands, the isolation is approximately 40 dB, and the thickness is approximately 1 millimeter.

The RF circulator disclosed herein can be integrated in hand-held devices such as, but not limited to, a cellular telephone, a smartphone, a tablet computer, a laptop computer, a wearable electronic device, and the like. The RF circulator can also be integrated in other communication devices, such as radars (e.g., for autonomous car), base-station, routers, and so on. The proposed design is based on a network of couplers coupled through delay lines. Specifically, each pair of couplers are coupled to each other using a pair of delay lines. These components create a network of couplers shown in FIG. 2. The network can contain several stages. In a simple embodiment, the network contains only one stage.

Figure 2:
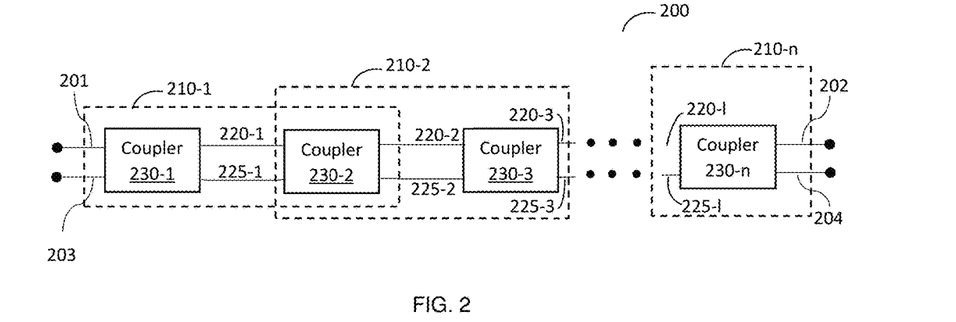
FIG. 2 is a schematic diagram of a RF circulator designed according to an embodiment.

FIG. 2 shows an example diagram of a wide band RF circulator 200 designed according to an embodiment. The RF circulator 200 includes a number of stages 210-1 through 210-n (where 'n' is an integer equal to or greater than 1). Thus, in some configurations, the RF circulator 200 includes only one stage. In an embodiment, the number of stages, and hence the number of couplers, determines the bandwidth of the circulator 200. The higher the number of stages are, the higher the bandwidth is.

The RF circulator 200 includes 4 ports 201, 202, 203, and 204 to "circulate" a signal from one port to another. Specifically, in a forward direction, an input signal from the port 201 is output at port 202, while port 203 is the isolated port.

In a backward direction, an input signal at port 202 is output at port 203, while port 201 is the isolated port. Also, an input signal at port 203 is output at port 201, while port 202 is the isolated port. Port 204 is always grounded. It should be noted that, in certain implementations, the locations of ports 201 and 203 may be swapped, i.e., port 201 would be placed together with port 203 (at the same coupler) and port 202 would be placed together with port 204.

In an embodiment, each stage 210-$i$ in the RF circulator 200 is connected to the subsequent stage 210-$i$+1 using a pair of delay lines 220-I and 225-I (wherein is I=1, . . . , n). The delay lines 220-I are reciprocal delay lines, while the delay lines 225-I are non-reciprocal delay lines. In a simple case, reciprocal delay line 220-I is a conductive transmission line placed on a dielectric substrate. The non-reciprocal delay line 225-I can be built as a conductor placed on a ferrite (magnetic material) substrate. The various embodiments for designing reciprocal and non-reciprocal delay lines are discussed in detail herein below.

As demonstrated in FIG. 2, each stage is composed of 2 couplers 230-$j$ and 230-$j$+1 ($j$=1, . . . , n−1). The couplers 230 may have similar or different coupling factors. In an embodiment, each coupler 230 is a wide band 3 dB hybrid coupler. In a 3 dB hybrid coupler, the phase shift (difference) of the coupled output signal and the output signal is 90-degrees) (90°). An example implementation of a coupler is provided below. A 3 dB hybrid coupler divides the power equally (within a certain tolerance) between its output and its coupled output ports. The coupling factor of each 3 dB hybrid coupler 230 is substantially equal to 3 dB. In some configurations, each coupler 230 may be a wide band directional coupler.

As will be discussed below with reference to FIG. 4, a coupler has two output ports: one for an output signal, and the other for the coupled signal. In an embodiment, the outputs of each of the couplers 230 except for the coupler 230-$n$ are coupled to the respective delay lines. In an embodiment, the output port of each coupler is connected to the reciprocal delay line 220 and the coupled port to a non-reciprocal delay line 225.

Typically, the phase shifts between the output ports of a coupler are based, in part, on its coupling factor. For example, in a 3 dB coupler, the phase shift between these outputs is 90°. However, the delay lines further shift the phases of signals propagating through them. As a result, the amplitude and phase of the signals are changed after each stage. In an embodiment, the RF circulator 200 is designed to ensure that phase shifts between signals propagated over the delay lines 220-$i$ and 225-$i$+1 would combine the propagated signals to a complete signal at any of the current output ports (i.e., either of the ports 201, 202, and 203). Various embodiments for determining the phase shifts between the delay lines 220-$i$ and 225-$i$+1 to meet this constraint are discussed below.

The disclosed embodiments allow for designing a RF circulator 200 that can be served for different applications. The design of the RF circulator 200 for a specific application may be a function of the number of stages 210, the coupling factor of each coupler 230, and the characteristics of each of the non-reciprocal delay lines. Some example designs are provided below.

Figure 3A:
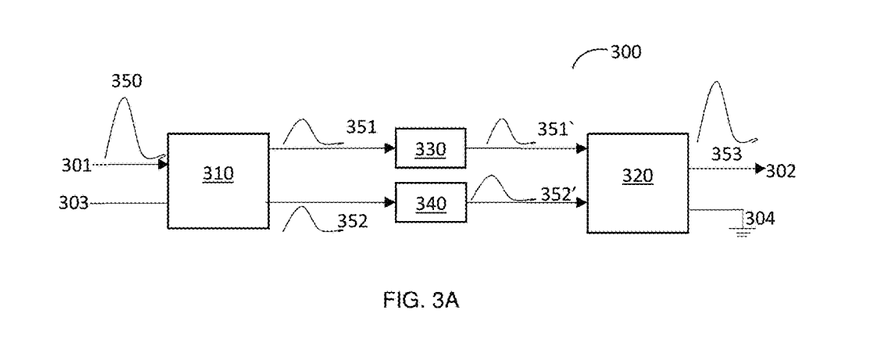
FIGS. 3A and 3B are block diagrams of a single-stage RF circulator utilized to describe the various disclosed embodiments.
Figure 3B:
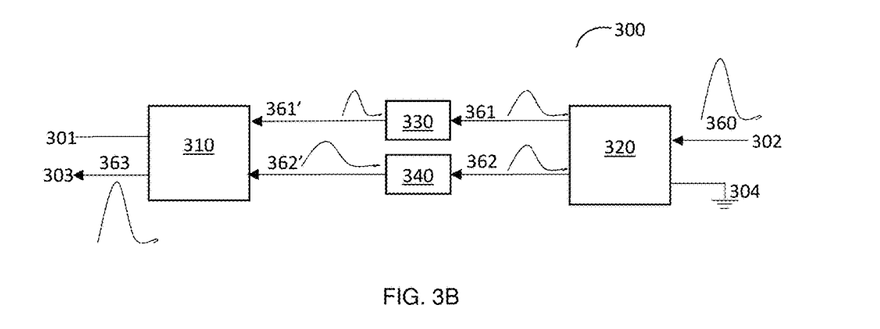

FIG. 3A and FIG. 3B are example block diagrams of a single-stage RF circulator 300 utilized to describe the various disclosed embodiments. FIG. 3A demonstrates the operation in the forward direction, while FIG. 3B shows the operation in the backward direction.

The RF circulator 300 (shown in both FIGS. 3A and 3B) includes a pair of 3 dB couplers 310 and 320 connected using a reciprocal delay line 330 and a non-reciprocal delay line 340. The ports of the RF circulator 300 are 301, 302, 303, and 304 which is grounded. As noted above, each 3 dB couplers 310 and 320 divides the power equally (within a certain tolerance) between its the output and coupled output ports.

Referring now to FIG. 3A, in a forward direction, an input signal at port 301 is output at port 302, while port 303 is the isolated port. According to an embodiment, the coupler 310 divides an input signal 350 at port 301 into two signals 351 and 352 having substantially equal amplitudes. This is due to the fact that the coupler 310 respectively outputs an output signal 351 to the reciprocal delay line 330 and a coupled signal 352 to the non-reciprocal delay line 340. The power of each signal 351 and 352 is around half the power of the input signal 350. The phase shifts between the signals 351 and 352 is substantially 90°.

The signals 351 and 352 are respectively propagated through the delay lines 330 and 340 and input to the coupler 320. The phase shifts between the signals 351 and 352 would be different than 90° due to the characteristics of the delay lines. However, the phase shifts for non-reciprocal delay line 340 and reciprocal delay line 330 are determined in such a way that the signals 351' and 352' are combined at the output port 302. That is, the amplitudes of the signals 351' and 352' are summed up and do not cancel each other. The combined signal 353 is output at port 302. As port 304 is grounded, no signal is output at this port.

Referring now to FIG. 3B, in a backward direction, an input signal 360 at port 302 is output at port 303, while port 301 is the isolated port. According to an embodiment, the coupler 320 divides an input signal 360 into two signals (361, 362) that may have substantially equal amplitude. This is due to the fact that the coupler 320 yields an output signal 361 to the reciprocal delay line 330 and an induced (coupled) signal 362 to the non-reciprocal delay line 340, respectively. The power of each signal 361 and 362 is half the power of the input signal 360. The phase shifts between the signals 361 and 362 is substantially 90°.

The signals 361 and 362 are propagated through the delay lines 330 and 340, respectively, and input to the coupler 310. The phase shifts between the signals 361' and 362' would be different by more than 90° due to the characteristics of the delay lines. However, the phase shifts for the non-reciprocal delay line 340 and reciprocal delay line 330 are determined in such a way that the signals 361' and 362' are combined at the output port 303. That is, due to the phase shifts of the signals 361' and 362' the amplitudes of these signals are summed up and do not cancel each other. The combined signal 363 is output at port 303. As port 301 is the isolated port, no signal is output at this port. In another configuration, an input signal at port 303 is split by the coupler 320 and combined at port 301. As port 304 is grounded, no signal is output at this port.

In an embodiment, there is no phase difference between the "forward signal" (351) and the "backward signal" (361) propagated through the reciprocal delay line 330. On the other end, there is a 180°-phase difference between the "forward signal" (352) and the "backward signal" (362) propagated through the non-reciprocal delay line 340. It should be noted that the 180°-phase difference is when the number of stages in the RF circulator is 1 and coupling factor of the couplers is 3 dB. In another embodiment, when the number of stages is more than 1 and coupling factors are different, the phase difference may be different from 180°.

Various examples are provided below. It should be further noted that signals having the same frequency can be simultaneously propagated in both forward and backward directions over the delay lines allowing a full-duplex mode of operation.

It should be appreciated that the operation of the RF circulator with one stage is performed merely for the sake of simplicity. The disclosed embodiments described with references to FIGS. 3A and 3B are equally applicable to a RF circulator that includes multiple-stages. For example, for a RF circulator that includes 3 couplers, the intermediate coupler divides a combined signal into two signals and induces such signals into reciprocal and non-reciprocal delay lines of the second stage. The last coupler of the second signal combines the signals and immediately divides the combined signal into two signals (not shown) and induces such signals into reciprocal and non-reciprocal delay lines of the third coupler of the second stage. The third coupler of the device combines the signals in to a common output line. In some embodiments, the connection between some but not all couplers can be performed using reciprocal delay lines.

In order to meet the demand for an efficient RF circulator having a wide bandwidth and a low insertion loss, the couplers are designed accordingly. Specifically, in an embodiment, each coupler is designed with a coupling factor substantially equal to 3 dB, low return loss (e.g., less than −10 dB), high isolation loss (e.g., more than 15 dB), low amplitude imbalance (less than 0.4 dB), and low phase imbalance (less than 3 degrees). In a further embodiment, the bandwidth of the coupler is between 3 GHz and 7 GHz. An example wide band coupler that can be utilized in the disclosed RF circulator is shown in FIG. 4.

Figure 4:
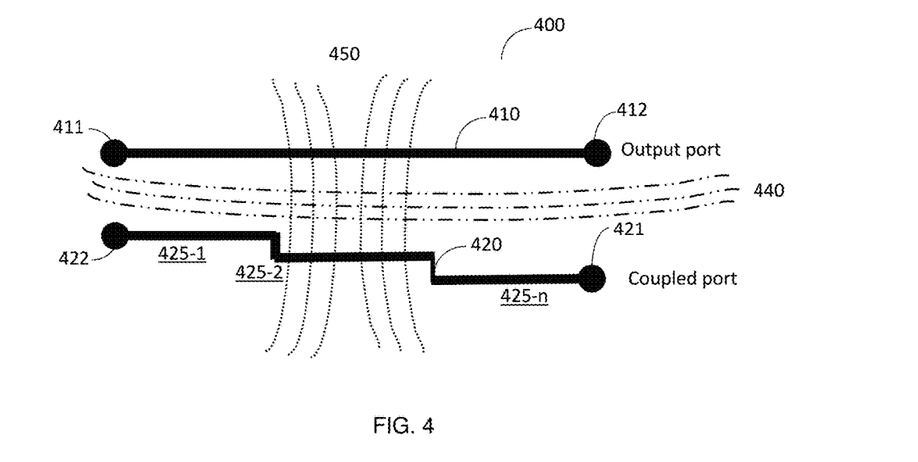
FIG. 4 is an example diagram of a wide band coupler that can be utilized in the disclosed RF circulator according to an embodiment.

As demonstrated in FIG. 4, a wide band coupler 400 includes a main transmission line 410 and a coupling transmission line 420. In an embodiment, the coupler 400 is a miniature coupler and the transmission lines 410 and 420 are realized as micro-strips, strip-lines, or any other planar or other 3D technologies. The realization of the transmission lines 410 and 420 may include fabrication of the lines on dielectric layers, or a combination thereof, using for example, a low temperature co-fired ceramic (LTCC) process.

The coupler 400 couples radio frequency (RF) signals and can be utilized, for example, for power sensing or probing of an input RF signal. As shown in FIG. 4, a first end and a second end of the main transmission line 410 are at input port 411 and at output port 412, respectively. A first end and a second end of the coupling transmission line 420 are a coupled port 421 and an isolated port 422, respectively. The isolated port 422 may be connected to a common ground (not shown).

A RF signal is provided at the input port 411. Due to the mutual inductance and the mutual capacitance between the main transmission line 410 and the coupling transmission line 420, a portion of the input RF signal is induced in the coupling transmission line 420. The induced RF signal traverses through the coupling transmission line 420 and is output at the coupled port 421. The remaining portion of the input RF signal traverses through the main transmission line 410 and is output at the output port 411.

Accordingly, the coupler 400 operates at a wide frequency band. That is, the coupling factor value of the wide band coupler 400 would remain substantially constant for any RF signal having frequency within the operation bandwidth of the coupler 400. In an example embodiment, the operating bandwidth is between 1 GHz and 7 GHz.

The coupling factor value of the coupler is a function of the RF signal's frequency, spacing between the transmission lines, and the length of the transmission lines. In an embodiment, the coupling factor value is 3 dB with some tolerance. The mutual inductance and mutual capacitance existing between the transmission lines 410 and 420 is determined in part based on the spacing between the transmission lines 410 and 420.

The coupling transmission line 420 of the coupler 400 is structured as a combination of quarter wave length ($\lambda/4$) coupling lines 425-1 through 425-$n$. As shown in FIG. 4, the coupling transmission line 420 is formed of 'n' $\alpha/4$ lines (where 'n' is an integer greater than 1). The coupling lines 425-1 through 425-$n$ will be referred to hereinafter collectively as "$\lambda/4$ coupling lines 425" or individually as a "$\lambda/4$ coupling line 425". It should be noted that a $\lambda/4$ coupling line 425 can be realized as a micro-strip, a strip-line, or as any other planar technology.

The wide band coupler 400 is structured with a capacitive connection, an inductive connection, or both, between the main transmission line 410 and the coupling transmission line 420. The capacitive connection, the inductive connection, or both, are designed to ensure relatively low capacitance and inductance values of the coupler 400. The capacitive connection 440 and the inductive connection 450 are schematically labeled for illustrative purposes only. Additional examples for couplers that can be utilized according to the disclosed embodiments are further discussed in co-pending U.S. application Ser. No. 15/434,800, assigned to the common assignee, which is hereby incorporated for all that it contains.

In an embodiment, the coupler 400 is connected in the RF circulator in the following manner. For each intermediate coupler in the RF circulator, ports 411 and 412 are connected to reciprocal delay line(s), while ports 421 and 422 are connected to the non-reciprocal delay lines. A coupler 400 placed as the first coupler in the RF circulator, the ports 411 and 412 are respectively port 1 and port 3 of the circulator. A coupler 400 placed as the last coupler in the RF circulator, the ports 412 and 421 are respectively port 2 and the ground of the circulator.

A foundational aspect to allow for an RF circulator that meets the above-noted demand is the design of the delay lines, and specifically the non-reciprocal delay line. According to an embodiment, the reciprocal lines provide the same phase shift "forward signals" and "backward signals", i.e., signals propagated at both directions of the lines. The non-reciprocal delay lines provide different phase shifts for signals propagating in opposite directions (from port 1 to port 2 and vice versa).

Figure 5:
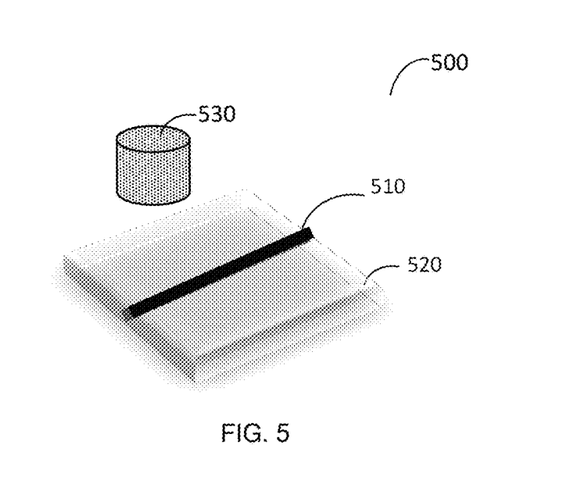
FIG. 5 is a diagram illustrating a design of a non-reciprocal delay line according to an embodiment.

FIG. 5 shows an example diagram illustrating a design of a non-reciprocal delay line 500 according to an embodiment. The non-reciprocal delay line 500 is structured using a conductor 510 placed on a ferrite substrate 520. The conductor 510 may be made of any conductive material (e.g., gold, copper, silver, etc.) and realized as a micro-strip or a strip-line or any other patterning technology. The ferrite substrate 520 is selected or designed with magnetic properties to support the frequency band of the RF circulator.

The non-reciprocal delay line 500 further includes at least one magnet 530 forming a magnetic field. In an embodiment, the magnet 530 is directly attached to the conductor 510. The magnet 530 may be shaped as a cylinder, a coin, a film, or the like. In a non-limiting embodiment, the magnetic field is orthogonal to the conductor 510.

Figure 6:
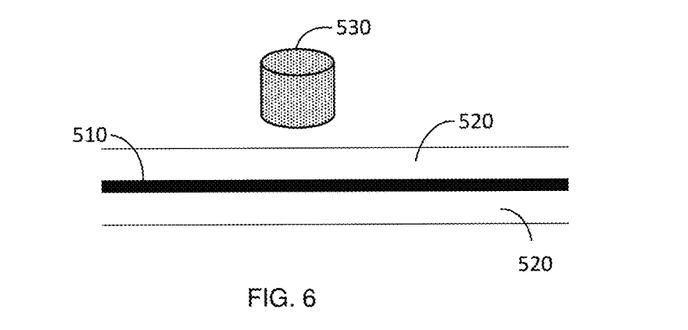
FIG. 6 is a cross-section diagram of a non-reciprocal delay line designed according to another embodiment.

In an embodiment, the conductor 510 is placed on a surface of the ferrite substrate 520. In another embodiment, the conductor 510 is placed between the layers of the ferrite substrate 520. This embodiment is further demonstrated in FIG. 6 where a cross-section diagram of the non-reciprocal delay line 500 is shown.

The properties of the non-reciprocal delay line 500, such as the length of the conductor 510, the magnetic properties of the substrate 520, the strength of the magnetic field by the magnet 530, or a combination thereof, are determined based on the required phase shifts (in forward and backward directions) over the non-reciprocal line. The properties of the non-reciprocal delay line may be determined based on a set of Maxwell equations. It should be noted that the phase shifts for both delay lines should remain constant (within a predefined tolerance) throughout the bandwidth of the RF circulator.

Figure 7:
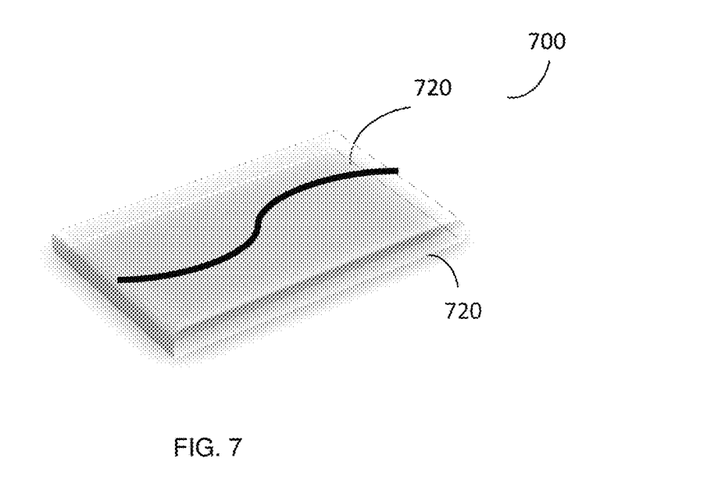
FIG. 7 is a design of a reciprocal delay line according to an embodiment.

FIG. 7 shows an example diagram illustrating a design of a reciprocal delay line 700 according to an embodiment. A conductive line 710 is placed on a dielectric substrate 720. The length of the conductive line 710 is determined based on the phase shift required to achieve for signals propagating the reciprocal delay line 700. Further, the phase shifts of signals propagating in opposite directions over the reciprocal delay line does not have any phase shift.

It should be noted that a RF circulator including multiple stages is designed with a plurality of non-reciprocal delay lines and reciprocal delay lines. Each of the non-reciprocal delay lines and each of the reciprocal delay lines in such a design may have different properties to account for different phase-shifts.

Figure 8:
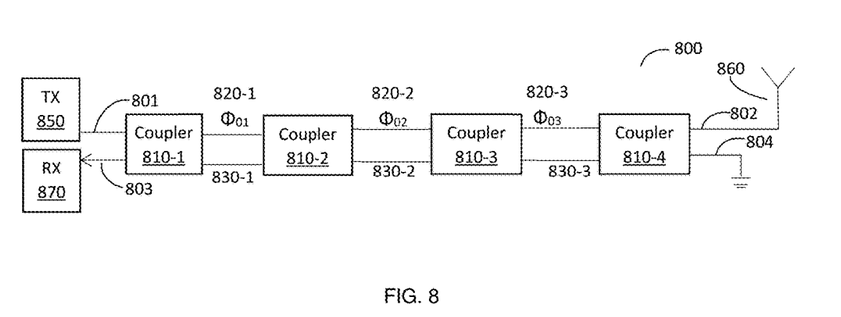
FIG. 8 is an example diagram of a three-stage RF circulator designed according to one embodiment.

As an example, an RF circulator 800, shown in FIG. 8, includes 4 couplers 810-1 through 810-4 (framed in 3-stages, not shown). The couplers 810-1 through 810-4 are respectively connected through reciprocal delay lines 820-1, 820-2, and 820-3. The couplers 810-1 through 810-4 are also connected through non-reciprocal delay lines 830-1, 830-2, and 830-3. The phase shifts of the reciprocal delay lines 820-1, 820-2, and 820-3 are respectively labeled as $\Phi_{01}$, $\Phi_{02}$, and $\Phi_{03}$. The phase shifts of the non-reciprocal delay lines 830-1, 830-2, and 830-3 in the forward direction are respectively $\Phi_{11}$, $\Phi_{12}$, and $\Phi_{13}$, while in the backward direction they are respectively as $\Phi_{21}$, $\Phi_{22}$, and $\Phi_{23}$.

In the example RF circulator 800, each of the couplers 810-1 through 810-4 is a 3 dB coupler. The phase shifts of the delays lines are as follows: $\Phi_{01}=-126°$ $\Phi_{02}=-124°$ and $\Phi_{03}=-136°$; $\Phi_{11}=-149°$, $\Phi_{12}=40°$, and $\Phi_{13}=48°$; $\Phi_{21}=-2$, $\Phi_{22}=-180°$, and $\Phi_{23}=181°$ The example RF circulator 800 can serve as a full-duplex passive element for receiving and transmitting RF signals. In such configuration, a transmitter (TX) 850 is connected to the port 1 (801), an antenna 860 is connected to a port 2 (802), and a receiver (RX) 870 is connected to port 3 (803). Thus, signals from the transmitter 850 are transmitted through the antenna 860, and signals received at the antenna 860 are output to the receiver 870.

Figure 9:
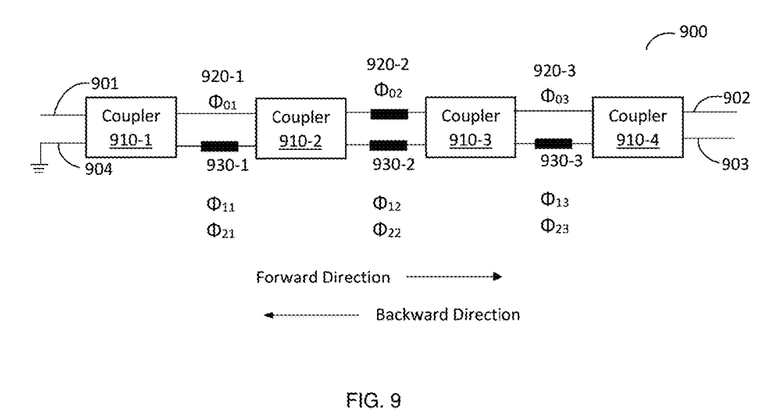
FIG. 9 is an example diagram of a three-stage RF circulator designed according to another embodiment.

FIG. 9 shows an example RF circulator 900 designed according to another embodiment. In this embodiment, the connection between one stage is performed using reciprocal delay lines. The RF circulator 900 includes 4 couplers 910-1 through 910-4 (framed as 3-stages, not shown). The couplers 910-1 and 910-2 as well as couplers 910-3 and 910-4 are connected through reciprocal delay lines 920-1 and 920-3. The couplers 910-1 through 910-4 are respectively connected through non-reciprocal delay lines 930-1, 930-2, and 930-3. As can be noted, the couplers 910-2 and 910-3 are coupled using two non-reciprocal delay lines 920-2, and 930-3.

The phase shifts of the reciprocal delay lines 920-1 and 920-2 are respectively labeled as $\Phi_{01}$, and $\Phi_{02}$. The phase shifts of the non-reciprocal delay lines 930-1, 930-2, and 930-3, and 930-4 in the forward direction are respectively $\Phi_{11}$, $\Phi_{12}$, $\Phi_{13}$, and $\Phi_{14}$, while in the backward direction they are $\Phi_{21}$, $\Phi_{22}$, $\Phi_{23}$, and $\Phi_{24}$.

In the example RF circulator 900, each of the coupler 910-1 through 910-4 has a coupling factor of 8.3 dB. The phase shifts of the delays lines are as follows: $\Phi_{01}=180°$ $\Phi_{02}=180°$; $\Phi_{11}=0°$, $\Phi_{12}=0°$, and $\Phi_{13}=0°$; $\Phi_{21}=0°$, $\Phi_{22}=0°$, and $\Phi_{23}=0°$.

Figure 10:
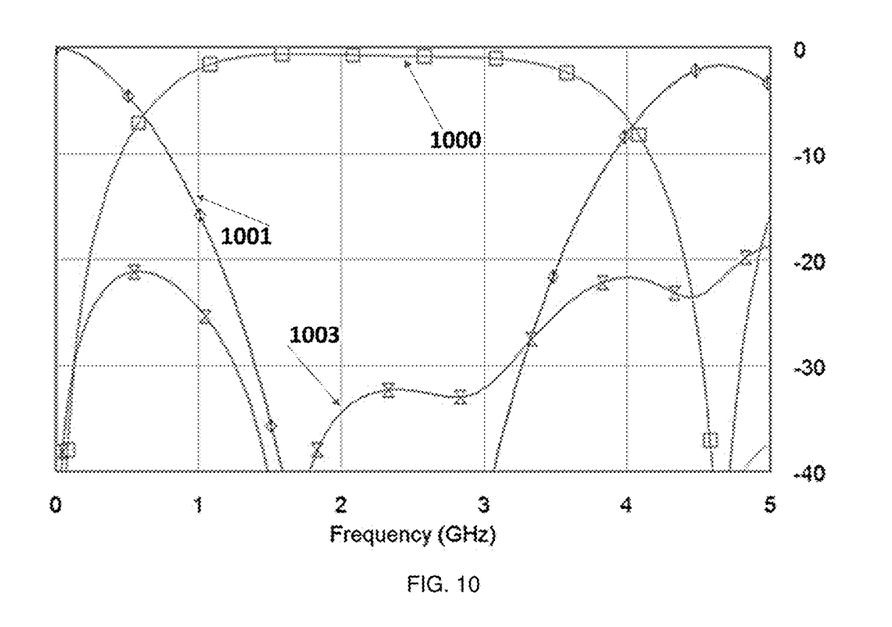
FIG. 10 is a graph demonstrating the performance of a RF circulator constructed according to an embodiment.

In an example configuration, the RF circulator can operate in a frequency band between 1 GHz and 5 GHz. In this band, an output signal (at each output port) remains at the same level, thus are not attenuated in response to changes in the signal's frequency. A graph 1000 showing an output signal value versus the frequency band is illustrated in FIG. 10. Specifically, the graph 1000 demonstrates a signal input at port 1 and output at port 2 (in the forward direction). The graph 1001 is the isolation between port 2 and port 3 (in the forward direction). One of ordinary skill would appreciate that the RF circulator, designed using the disclosed embodiments, has adequate isolation for you're a wide bandwidth of about 1 GHz-5 GHz.

The graph 1003 also depicts the signal reflection, which is low. It should be noted that any reflections caused by any mismatches will end up at the termination of the RF circulator and not propagate back into the signal source.

According to certain embodiments, a RF circulator can be designed using, for example, a CAD design tool configured with certain constraints to allow proper operation while meeting the requirements set of the RF circulator. Such requirements may include, but are not limited to, bandwidth and low insertion loss.

In an example embodiment, the constraints may include:

1) for signals induced at port 1 (in the backward direction), signals combined by the last coupler on port 2 and port 3 should have equal amplitudes. Further, signals combined on the port 2 should be with syn-phase and signals combined on port 3 should have opposite phases;

2) for the signal induced at port 2 (in the backward direction), signals combined by the last coupler on port 1 should have equal amplitudes and opposite phases. In such a case, an input RF signal is entirely output at port 3; and 3) for the signal induced at port 3, signals combined by the last coupler on port 1 should have the equal amplitudes and be syn-phase. In such a case, an input RF signal at port 3 is entirely output at port 1.

It should be understood that any reference to an element herein using a designation such as "first," "second," and so forth does not generally limit the quantity or order of those elements. Rather, these designations are generally used herein as a convenient method of distinguishing between two or more elements or instances of an element. Thus, a reference to first and second elements does not mean that only two elements may be employed there or that the first element must precede the second element in some manner. Also, unless stated otherwise, a set of elements comprises one or more elements.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; A and B in combination; B and C in combination; A and C in combination; or A, B, and C in combination.

All examples and conditional language recited herein are intended for pedagogical purposes to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A wide band radio frequency (RF) circulator, comprising: at least one stage having four ports configured to circulate an input RF signal from a first port to a second port while isolating a third port, from the second port to the third port while isolating the first port, and from the third port to the first port while isolating the second port, wherein the fourth port is grounded; wherein the at least one stage includes at least a pair of couplers connected via a delay line, wherein each coupler includes a main transmission line and a coupling transmission line disposed on distinct dielectric layers.

2. The wide band RF circulator of claim 1, wherein each stage is connected to a subsequent stage via the pair of couplers.

3. The wide band RF circulator of claim 1, wherein each coupler comprises a wide band coupler configured to divide the RF signal equally between an output port and a coupled output port.

4. The wide band RF circulator of claim 3, wherein a coupling factor of the wide band couple is 3 dB.

5. The wide band RF circulator of claim 3, wherein a phase shift between the output and the coupled output is 90 degrees.

6. The wide band RF circulator of claim 1, wherein all pairs of couplers in the at least one stage has the same coupling factor.

7. The wide band RF circulator of claim 1, wherein each pair of couplers in the at least one stage has different coupling factors.

8. The wide band RF circulator of claim 1, wherein each of the pair of couplers are connected through a reciprocal delay line and a non-reciprocal delay line, thereby forming a network of couplers in the at least one stage.

9. The wide band RF circulator of claim 8, wherein the reciprocal delay line includes a conductive line placed on a dielectric substrate.

10. The wide band RF circulator of claim 8, wherein the non-reciprocal delay line includes a conductor placed on a ferrite substrate and a magnet attached to the conductor.

11. The wide band RF circulator of claim 8, wherein phase shifts between a first signal and a second signal propagated over the reciprocal delay is zero, wherein the first signal is input from the first port and the second signal is input from the second port.

12. The wide band RF circulator of claim 8, wherein phase difference between a first signal and a second signal propagated over the non-reciprocal delay is 180 degrees, wherein the first signal is input from the first port and the second signal is input from the second port.

13. The wide band RF circulator of claim 12, wherein phase shifts between the first signal and the second signal remain substantially constant through a bandwidth of the RF circulator.

14. The wide band RF circulator of claim 1, further comprising: a transmitter connected to the first port; an antenna connected to the second port; and a receiver connected to the third port.

15. The wide band RF circulator of claim 14, wherein the signals simultaneously propagate from the first port to the second port and from the second port to the third port.

16. The wide band RF circulator of claim 1, wherein each of the couplers includes: a coupling transmission line having a first length and connected between a coupling port and an isolated port, wherein the coupling transmission line is coupled to the main transmission line through a coupling capacitive connection and a mutual inductive connection, wherein at least a distance between the main transmission line and the coupling transmission line varies along the first length of the coupling transmission line such that any one of a capacitance value of the capacitive connection and an inductance value of the inductive connection is characterized by a relatively low value, wherein a coupling factor of the wide band couple remains substantially constant throughout an operating frequency band of the wide band coupler, wherein the main transmission line partially overlaps the coupling transmission line.

17. The wide band RF circulator of claim 1, wherein a bandwidth of the RF circulator is between 1 Giga Hertz (GHz) and 7 GHz, wherein the operating frequency of the RF circulator includes a plurality of distinct frequency bands.

18. The wide band RF circulator of claim 1, wherein the wide band RF circulator is configured to operate as an RF isolator.

* * * * *